(12) United States Patent
Fujita et al.

(10) Patent No.: US 7,096,241 B2
(45) Date of Patent: Aug. 22, 2006

(54) EXPONENT ENCODER CIRCUIT AND MASK CIRCUIT

(75) Inventors: Mikio Fujita, Hyogo (JP); Naofumi Waku, Hyogo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 714 days.

(21) Appl. No.: 10/152,779

(22) Filed: May 23, 2002

(65) Prior Publication Data

US 2003/0146860 A1    Aug. 7, 2003

(30) Foreign Application Priority Data

Jan. 18, 2002    (JP)  ............................. 2002-009768

(51) Int. Cl.
*G06F 15/00*    (2006.01)
(52) U.S. Cl. ....................................... 708/211; 708/205
(58) Field of Classification Search ................ 708/205, 708/211
See application file for complete search history.

(56) References Cited

U.S. PATENT DOCUMENTS 5,345,405 A * 9/1994 Walsh et al. ................ 708/211
5,383,142 A * 1/1995 Chung ......................... 708/212
5,553,012 A    9/1996 Buss et al.
5,657,260 A * 8/1997 Makino ....................... 708/211
5,726,924 A    3/1998 Buss et al.

FOREIGN PATENT DOCUMENTS

| JP | 62-229436  | 10/1987 |
| JP | 4-167124   | 6/1992  |
| JP | 8-212055   | 8/1996  |
| JP | 2000-259392 | 9/2000 |

* cited by examiner

*Primary Examiner*—Chuong D. Ngo
(74) *Attorney, Agent, or Firm*—VolentineFrancos&Whitt PLLC

(57) ABSTRACT

In order to provide an exponent encoder circuit for obtaining an exponent constituted by a left shift amount for normalizing input data with code bits, there is provided a first logic circuit for inverting data portions other than code bits and shifting the code bits to least significant bit positions when inputted data is a negative number and allowing data portions other than the code bits to pass as is and moving the code bits to least significant bit positions when the inputted data is a positive number, and a second logic circuit for putting a plurality of logic operation equations for obtaining each bit of an exponent from output of the first logic circuit as decided by a truth table for outputs of the first logic circuit and corresponding exponents in a form where common terms are cancelled out.

2 Claims, 7 Drawing Sheets

EXPONENT ENCODER CIRCUIT AND MASK CIRCUIT

1. FIELD OF THE INVENTION

This invention relates to exponent encoder circuits occurring in processors etc. and to mask circuits that can be applied to exponent encoder circuits.

2. DESCRIPTION OF THE RELATED ART

Exponent encoder circuits are circuits for obtaining left shift amounts for normalizing input data configuring an exponent. Bits of ineffective orders are then eliminated by normalizing input data using the results of exponent encoding (left shift amount). It is also therefore possible to implement calculations while maintaining accuracy by also considering a left shift amount for multiplication of small values.

If the exponent encoder circuit has input data with eight bits of code, exponent encoding results (OUTPUT) are outputted for input data (INPUT) according to the truth table shown in table 1. For example, if the input data is 02h (00000010), the exponent encoding results are 5(101), and when left shifting is carried out five times, the data after shifting becomes 01000000 (with the most significant 0 indicating a positive number).

TABLE 1

| INPUT positive number | OUTPUT | INPUT negative number | OUTPUT |
|---|---|---|---|
| 00000000 | 000(0) | 11111111 | 111(7) |
| 00000001 | 110(6) | 11111110 | 110(6) |
| 00000010~00000011 | 101(5) | 11111100~11111101 | 101(5) |
| 00000100~00000111 | 100(4) | 11111000~11111011 | 100(4) |
| 00001000~00001111 | 011(3) | 11110000~11110111 | 011(3) |
| 00010000~00011111 | 010(2) | 11100000~11101111 | 010(2) |
| 00100000~00111111 | 001(1) | 11000000~11011111 | 001(1) |
| 01000000~01111111 | 000(0) | 10000000~10111111 | 000(0) |

Conventionally, exponent encoder circuits count the exponent using a shift operation, as with that shown in FIG. 2, or detect the position of bits different to the code bits and encode the exponents using the detected positions, as with that shown in FIG. 3. FIG. 2 corresponds to input data that does not have code assigned.

The related exponent encoder circuit shown in FIG. 2 operates as follows.

(1) Input data In is stored in storage element 11 and storage element 12 is initialized by being made to store 0h.

(2) The output of storage element 11 is inputted to shifter SFT, and a left shift of one bit is executed by the shifter SFT.

(3) The output of the shifter SFT is supplied to the storage element I1 via the selector s1 and is held.

(4) An exclusive NOR result is then obtained for the MSB of the output of the shifter SFT and the MSB of the input data using an exclusive NOR operation. When the MSB of the output of the shifter SFT and the MSB of the input data In are different data, the output of the exclusive NOR is "0", and the end signal FINISH is "1". If the output of the exclusive NOR is "1", the stored value of the storage element 12 is incremented by one by an ADDER and selector s2.

(5) (2) to (4) in the above are taken to be one cycle and are repeated until the end signal FINISH becomes "1". The output of the ADDER when the end signal FINISH becomes "1" is then taken to be an exponent EXP.

A circuit configuration for when the input data In is 0 is not disclosed in FIG. 2.

The related exponent encoder circuit shown in FIG. 3 operates as follows.

The exponent encoder circuit in FIG. 3 corresponds to data with eight bits of code.

If code bit In7 (MSB) of the input data In shows that the input data is a negative number (In7 is 1), the input data In is inverted by exclusive OR circuits (Ex-OR) I29 to I36, and if the code bit In7 (MSB) of the input data In shows that the input data is a positive number (if In7 is 0), the input data In is allowed to pass by the exclusive OR circuits (Ex-OR) I29 to I36, and outputs N6 to N0, NZ are obtained (where Nz expresses the code).

When this output data N6 to N0, NZ is viewed in order from the MSB, data up to the position of the bit directly before the position of the bit where "1" first appears is unnecessary (refer to table 1), and the exponent from this detected bit position is encoded.

The logic gates I1 to I25 of FIG. 3 construct a bit position detection circuit for detecting the position of the first bit that is "1".

Next, a description is given of the operation of the block of logic gates I1 to I12 when the logic gates I1 to I12 and I13 to I24 are respectively viewed as one block.

Looking ahead to the next stage, the logic gate I1 is a four input NOR circuit that becomes "1" when all of the items of data N6 to N3 are "0", with this being provided as a valid enable signal to the block (I13 to I24) of the next stage via the logic gate I14 only when the output of I1 is "1".

The logic gate I2 is for monitoring the enable signal up to the previous stage and is a four input NAND circuit that outputs "0" when the four inputs are all "1". The detection circuit of this block (I1 to I2) is then valid when the output of the logic gate I12 is "0". This logic gate I2 is provided to allow extension when the number of bits of input data is greater than 8 bits, with the four inputs to the logic gate I2 all being tied to "1" when the input data is 8 bit data.

The logic gates I3 and I4, and I5 to I8 are detection result transmission circuits for transmitting detection results for up to the previous bit (side of greater significance).

The logic gates I9 to I12 are detection flag generating circuits and are for performing a logic operation in such a manner that the output signal Find is "1" only at bit positions detected within the four bits, with other positions being at "0".

For example, when the data N6 is "1", the outputs of logic gates I5 to I8 are I5=0, I6=1, I7=0 and I8=1, and the outputs of the logic gates I9 to I12 are I9=1, I10=0, I11=0 and I12=0.

The less significant blocks I13 to I24 also operate in a similar manner, and as a result, only bits at detection positions within the 8 bits of the Find signal are "1", and other bits are "0".

The logic gate I25 is a gate for extending the bit length, and is not necessary when the input is fixed at 8 bits.

The logic gates I26 to I28 comprise a bit position detection encoder circuit for forming an exponent from the detected bit positions. The logic gates I26 to I28 perform encoding in order to obtain the amount of left shift required in the normalization of the input data using the detection bit position signal Find and obtain the exponent Exp.

However, with the related exponent encoder circuit shown in FIG. 2, a cycle lasting a few minutes is required for the same number of bits as that of input data at a maximum, so that even on average, a long period of time is required in order to obtain exponent encoding results. Therefore, when designing applications where the frequency of usage of processes for obtaining exponents is high, problems occur due to the processing time increasing whereby the speed of the application is reduced or where a process is not completed within a pre-decided processing time (for example, a sampling time).

With the related exponent encoder circuit shown in FIG. 3, the number of gate stages that are passed through is substantial and there are problems accompanying the high speed of the processor in that completion may no longer be achieved within one cycle, or the number of switches increasing due to the input delay times for each of the logic gates being different with the power consumption therefore increasing accordingly.

3. DISCLOSURE OF THE INVENTION

In a first aspect of this invention, an exponent encoder circuit for obtaining an exponent constituted by a left shift amount for normalizing input data with code bits configured with a two bit exponent, said circuit comprises a first logic circuit for inverting data portions other than code bits and shifting the code bits to least significant bit positions when inputted data is a negative number (or positive number) and allowing data portions other than the code bits to pass as is and moving the code bits to least significant bit positions when the inputted data is a positive number (or negative number) and a second logic circuit for putting a plurality of logic operation equations for obtaining each bit of an exponent from output of the first logic circuit as decided by a truth table for outputs of the first logic circuit and corresponding exponents in a form where common terms are cancelled out.

In a second aspect of this invention, in mask circuit having n-bit input data where the most significant bit of bit positions at one level is a marker logic level bit, with all bits at bit positions of lower significance than the marker logic level bit being put at one logic level and all bits at bit positions of greater significance than the bit position of the marker logic level bit being put at another logic level, said circuit comprising, said circuit comprises output data lines of the same number as there are items of input data, output line initialization transistors for charging (or discharging) each output line and putting each output line to a logic level based on an output line pre-processing signal, n output fixing transistors provided for n (where n=1 to N) output lines, for discharging (or charging) the respective output lines by inputting marker logic level bits to respective gates and input lines for inputting n bit values from the most significant bit side of the input data to respective gates of the n output fixing transistors for the nth (where n=1 to N) output line, wherein the input data is inputted to each input line after all of the output lines are put to one logic level based on the pre-processing signal for the output lines so that output data is formed at each of the output lines.

In a third aspect of this invention, an exponent encoder circuit for obtaining an exponent constituted by a left shift amount for normalizing input data with code configured with a two bit exponent, said circuit comprises a code matching circuit for converting to data for a positive number so that exponents become the same when inputted data is a negative number (or a positive number) and allowing data to pass as is when the inputted data is a positive number (or negative number), a mask circuit where a most significant bit position is included giving a marker logic level bit within the output of the code matching circuit with all bits at bit positions of lower significance being put at one logic level and all bits at bit positions of greater significance than the bit position of the most significant bit position given by the marker logic level bit being put at another logic level; and an encoder circuit for generating an exponent from the output of the mask circuit.

4. BRIEF DESCRIPTION OF THE DRAWINGS

5. DETAILED DESCRIPTION OF THE INVENTION

FIRST EMBODIMENT

Figure 1:
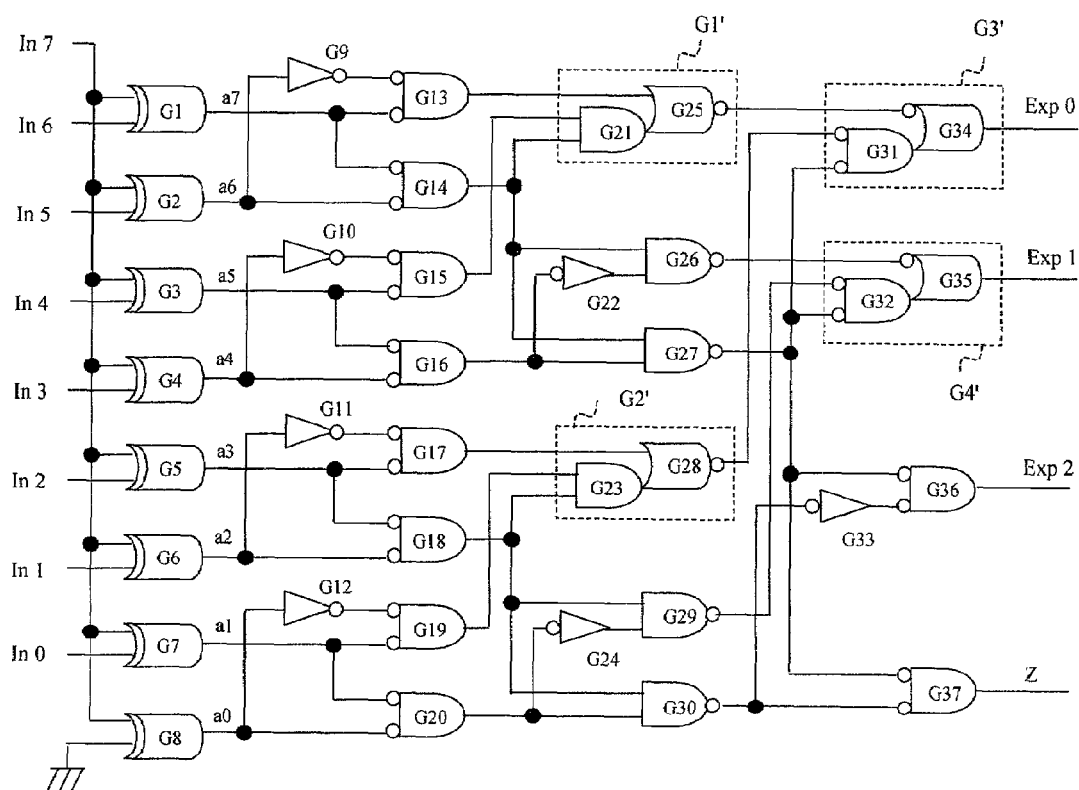
FIG. 1 is a block view showing an exponent encoder circuit of a first embodiment.
Figure 2:
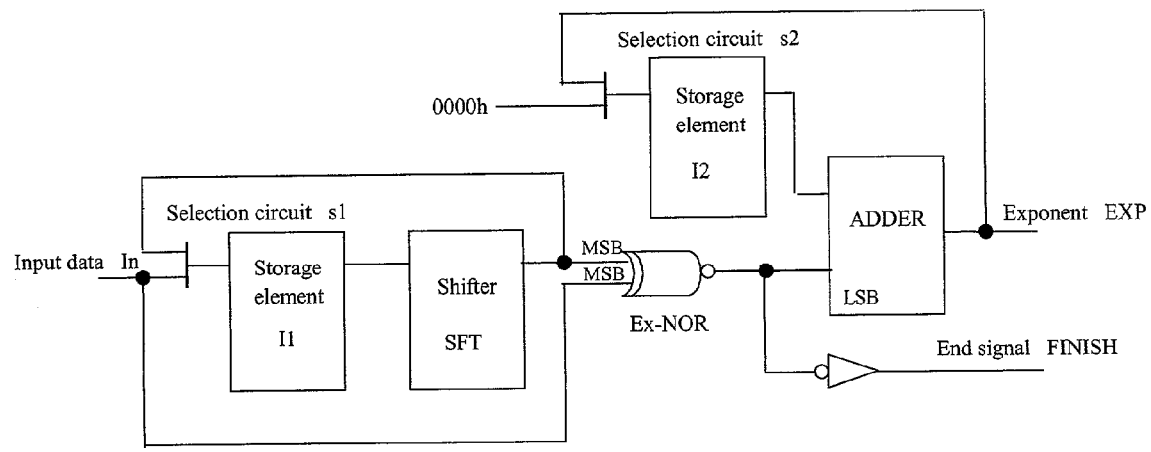
FIG. 2 is a block view showing a related circuit (first of two).

The following is a detailed description while referring to the drawings of a first embodiment of an exponent encoder circuit of this invention.

FIG. 1 is a block view showing the configuration of an exponent encoder circuit of the first embodiment. The exponent encoder circuit of the first embodiment is for handling input data (refer to table 1) with 8 bit code and obtains exponent encoding results Exp[2:0] and a zero detection signal Z from input data In[7:0].

As shown in FIG. 1, the exponent encoder circuit of the first embodiment is configured from a plurality of logic gates G1 to G37.

Code bit (MSB) In7 of the input data In is inputted to one input terminal of the eight two-input logic gates G1 to G8 of the exclusive OR circuit (Ex-OR circuit), with bit values In6, . . . , In0 for each bit position of the input data In and a fixed value "0" being inputted to the other input terminals.

The logic gates G1 to G8 invert bit portions other than the code occurring in the input data of negative numbers as shown in table 1 and allow bit portions of code other than the positive input data to pass as shown in table 1, with code bits being moved to the LSB position.

The relationship between output data a0 to a7 outputted from the logic gates G1 to G8, exponents Exp2 to Exp0 taken as results, and the zero detection signal Z is as shown by table 1 and table 2. Table 2 shows part of this relationship. In table 2, DC is either 0 or 1.

TABLE 2

| $a_7$ | $a_6$ | $a_5$ | $a_4$ | $a_3$ | $a_2$ | $a_1$ | $a_0$ | $E_2$ | $E_1$ | $E_0$ | Z |
|---|---|---|---|---|---|---|---|---|---|---|---|
| 0 | 0 | 0 | 0 | 0 | 0 | 0 | 0 | 0 | 0 | 0 | 1 |
| 0 | 0 | 0 | 0 | 0 | 0 | 0 | 1 | 1 | 1 | 1 | 0 |
| 0 | 0 | 0 | 0 | 0 | 0 | 1 | 0 | 1 | 1 | 0 | 0 |
| 0 | 0 | 0 | 0 | 0 | 0 | 1 | 1 | 1 | 1 | 0 | 0 |
| 0 | 0 | 0 | 0 | 0 | 1 | 0 | DC | 1 | 0 | 1 | 0 |
| 0 | 0 | 0 | 0 | 0 | 1 | 1 | DC | 1 | 0 | 1 | 0 |

TABLE 2-continued

| $a_7$ | $a_6$ | $a_5$ | $a_4$ | $a_3$ | $a_2$ | $a_1$ | $a_0$ | $E_2$ | $E_1$ | $E_0$ | Z |
|---|---|---|---|---|---|---|---|---|---|---|---|
| 0 | 0 | 0 | 0 | 1 | 0 | 0 | DC | 1 | 0 | 0 | 0 |
| 0 | 0 | 0 | 0 | 1 | 0 | 1 | DC | 1 | 0 | 0 | 0 |
| 0 | 0 | 0 | 0 | 1 | 1 | 0 | DC | 1 | 0 | 0 | 0 |
| 0 | 0 | 0 | 0 | 1 | 1 | 1 | DC | 1 | 0 | 0 | 0 |
| 0 | 0 | 0 | 1 | 0 | 0 | 0 | DC | 0 | 1 | 1 | 0 |
| 0 | 0 | 0 | 1 | 0 | 0 | 1 | DC | 0 | 1 | 1 | 0 |

DC: 0 or 1

From table 2, the exponents Exp2, Exp1 and Exp0 and the zero detection signal Z are obtained from the data a0 to a7 using the following logical equations (1) to (4).

$$\text{Exp2} = \overline{a7} \cdot \overline{a6} \cdot \overline{a5} \cdot \overline{a4} \cdot \overline{(\overline{a3} \cdot \overline{a2} \cdot \overline{a1} \cdot \overline{a0})} \quad (1)$$

$$\text{Exp1} = \overline{a7} \cdot \overline{a6} \cdot \overline{(\overline{a5} \cdot \overline{a4})} + \overline{a7} \cdot \overline{a6} \cdot \overline{a5} \cdot \overline{a4} \cdot \overline{(\overline{a3} \cdot \overline{a2}(\overline{a1} \cdot \overline{a0}))} \quad (2)$$

$$\text{Exp0} = \overline{a7} \cdot (a6 + \overline{a5} \cdot a4) + \overline{a7} \cdot \overline{a6} \cdot \overline{a5} \cdot \overline{a4} \cdot (\overline{a3} \cdot (a2 + \overline{a1} \cdot a0)) \quad (3)$$

$$Z = \overline{a7} \cdot \overline{a6} \cdot \overline{a5} \cdot \overline{a4} \cdot \overline{a3} \cdot \overline{a2} \cdot \overline{a1} \cdot \overline{a0} \quad (4)$$

Common terms in the arithmetic logic equations (1) to (4) are then cancelled out, with the logic gates G9 to G37 being provided as shown in FIG. 1 so as to implement the arithmetic logic equations after the common items are cancelled out.

Functionally speaking, the logic gates G21 and G25 are functionally speaking configured from two logic gates as shown in FIG. 1 but can be implemented using a single logic gate G1'. The logic gates G23 and G28, the logic gates G31 and G34, and the logic gates G32 and G35 may also similarly be implemented using single logic gates G2', G3' and G4'.

By performing the aforementioned canceling out of common items, the first logic operation performed on the 8 bit data a7 to a0 is a process configured for two bits at a time (a7 and a6, a5 and a4, a3 and a2, a1 and a0). The logic gates G9 to G12 and the logic gates G13 to G20 are also configured to perform processing two bits at a time.

The logic gates G9 to G12 are inverter circuits and the logic gates G13 to G20 are 2 input NOR circuits.

The output a7 from the logic gate G1 is inputted to the logic gates G13 and G14, and the output a6 from the logic gate G2 is inverted via the logic gate G9 for inputting to the logic gate G13, and is inputted to logic gate G14. The logic gates G13 and G14 output "01" when the data a7 and a6 is "00", the logic gates G13 and G14 output "10" when the data a7 and a6 is "01", and the logic gates G13 and G14 output "00" when the data a7 and a6 is "10" and "11".

In the case of an exponent encoder circuit, a "1" at the bit position of the MSB within a7 to a1 for the decoder causes a problem, and the cases where the two bits are "10" and "11" can be handled as being the same. When the two bits are "00", this means that the bit position giving a most significant bit of "1" does not exist within the data a7 to a1, and shows that there is a possibility that the bit position giving a "1" at the most significant bit within the data a7 to a1 is "1" of the two bits "01". Namely, it is sufficient to treat the four combinations for the two bits as three types.

The same meaning can also be applied to the logic gates G10, G15 and G16 with respect to data a5 and a6, the logic gates G11, G17 and G18 with respect to data a3 and data a2, and the logic gates G9, G13 and G14 with respect to the data a7 and a6.

The logic gates G12, G19 and G20 for data a1 and a2 have a different meaning to the aforementioned meaning but also classify the four combinations for the two bits into three different types.

As shown by the first line and second line in table 2, when the items of data a7 to a0 are all "0", and when the data a7 to a0 is "00000001", the exponents Exp2, Exp1 and Exp0 and the zero point detection signal Z have to be special values. In the case of these two types of data, just the combinations for the data a1 and a0 differ from "00" and "01" and it is therefore necessary to mark "00" and "01" as combinations for the data a1 and a0. The combinations of the data a1 and a0 influence the exponents Exp2, Exp1 and Exp0 (and the zero point detection signal Z) at the time of the third line and the fourth line in table 2 for times other than that state above. The exponents Exp2, Exp1 and Exp0 (and the zero point detection signal Z) are all the same value and it is therefore not necessary to distinguish between the combinations "10" and "11" for the data a1 and a0 at this time.

The logic operation from thereafter for every two bits using the logic gates G9 to G20 is then a logic operation carried out using logic bates G21 to G37 performed on the operation results for two bit units in such a manner that the desired exponents Exp2, Exp1 and Exp0 and the zero point detection signal Z are obtained.

When input data In7 to In0 is inputted for a negative number, bits other than the code bits are inverted using the logic gates G1 to G8 and the code bit is moved to the LSB. Further, when input data In7 to In0 is inputted for a positive number, bits other than code bits are allowed to pass as is by the logic gates G1 to G8 and the code bit is moved to the LSB. In the above processing, if either positive input data or negative input data is inputted where the exponents Exp2, Exp1 and Exp0 become the same, a conversion is made to data a7 to a0 where bits other than the code bits are the same.

After this, the exponents Exp2, Exp1 and Exp0 and the zero point detection signal Z are calculated in parallel and outputted using the logic gates G9 to G37 implementing the logical operation equations for obtaining the exponents Exp2, Exp1 and Exp0 from the data a7 to a0 obtained from the truth table for the data a7 to a0, the exponents Exp2, Exp1 and Exp0 and the zero point detection signal Z.

The following effects are obtained according to the exponent encoder circuit of the first embodiment.

Figure 3:
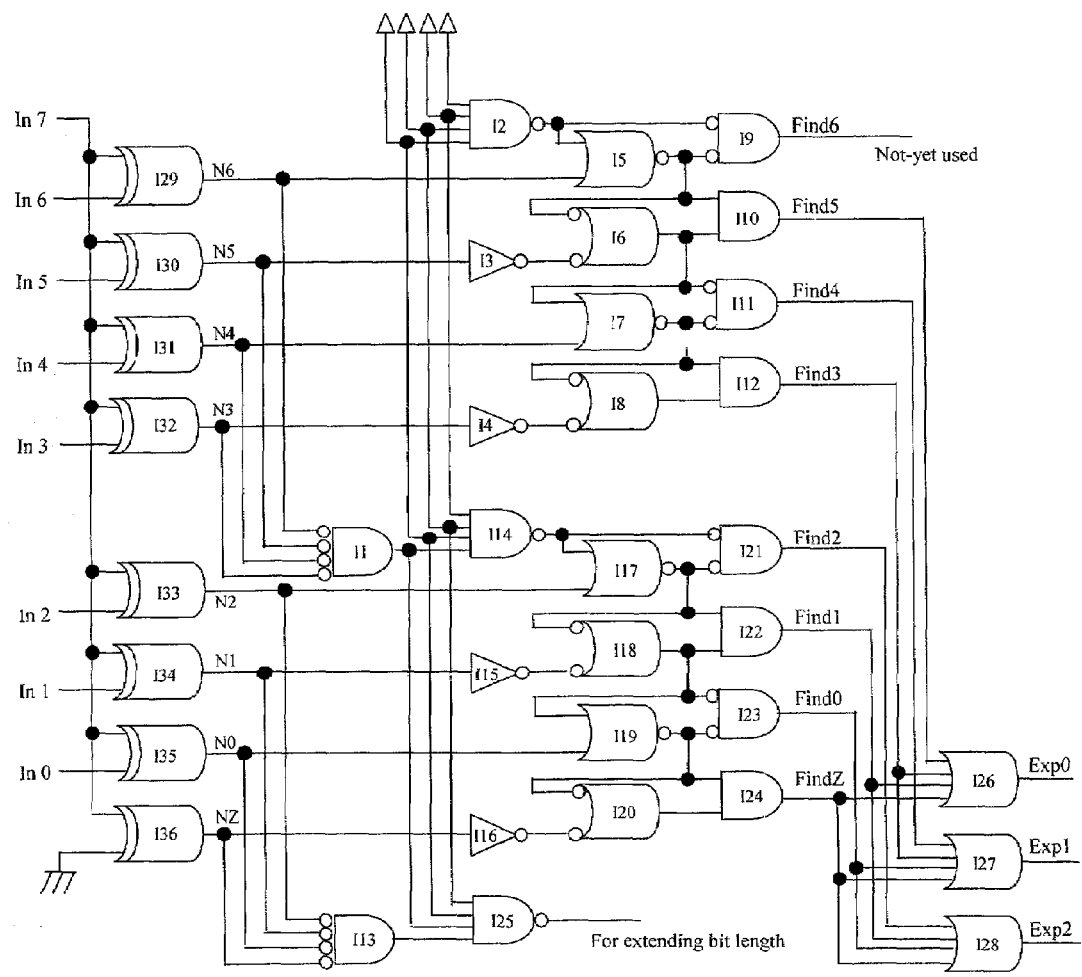
FIG. 3 is a block view showing the related circuit (second of two).

(1) High speed processing can be anticipated because the number of stages of logic gates that are passed through (number of logic stages passed through) is reduced. For example, the number of logic stages passed through in the critical path of the related circuit shown in FIG. 3 is nine, but the number of logic stages passed through in the first embodiment is a maximum of five stages, giving a reduction of four stages.

(2) It is therefore straightforward to make the input delay for each of the logic gates the same, wasteful switching is reduced, and consumption of power is suppressed.

(3) The input bit length can easily be extended. When the bit length is doubled to sixteen bits, the circuit of the first embodiment can be lined up in two stages, with one circuit constituting a more significant block and the other circuit constituting a less significant block. Final results can then be obtained by selecting the output Exp of the more significant block or the less significant block using the zero point detection signal of the more significant block (the zero point detection signal of the upper order block becomes the MSB of the outputted exponent, with the three bits selected for Exp being at less significant positions). The significance of the zero point detection signal for the more significant block is that there is no significant digit at the more significant eight bits of the 16 bit input data but there is a significant digit bit on the less significant side, with the insignificance of the zero point detection signal of the upper order block meaning that there is a significant digit bit on the more significant side of the 16 bit input. Namely, whether the digit for the most significant bit is in the more significant or less significant portion of the divided input data is shown by the zero detection signal of the more significant block and can be employed as a select instruction for the shift amount for the more significant or less significant 8 bits.

Figure 4:
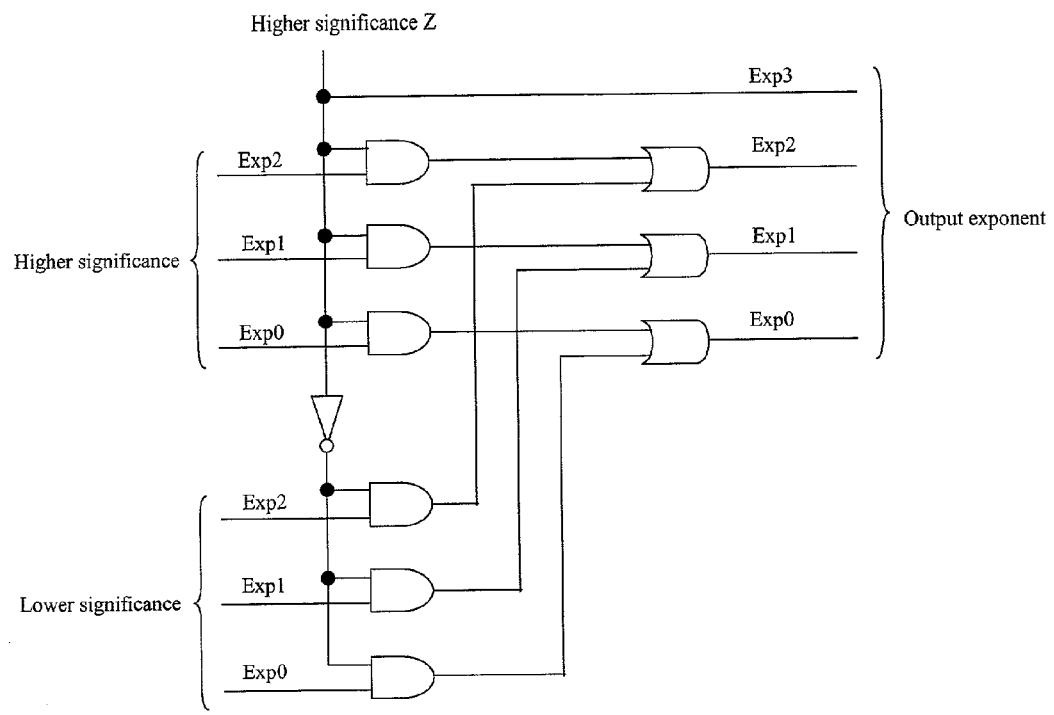
FIG. 4 is a block view showing portions of a circuit necessary while extending bit length using the circuit of the first embodiment.

In this case, combinations of AND/OR circuits as shown in FIG. 4 may be applied in place of the select circuits.

SECOND EMBODIMENT

Figure 7:
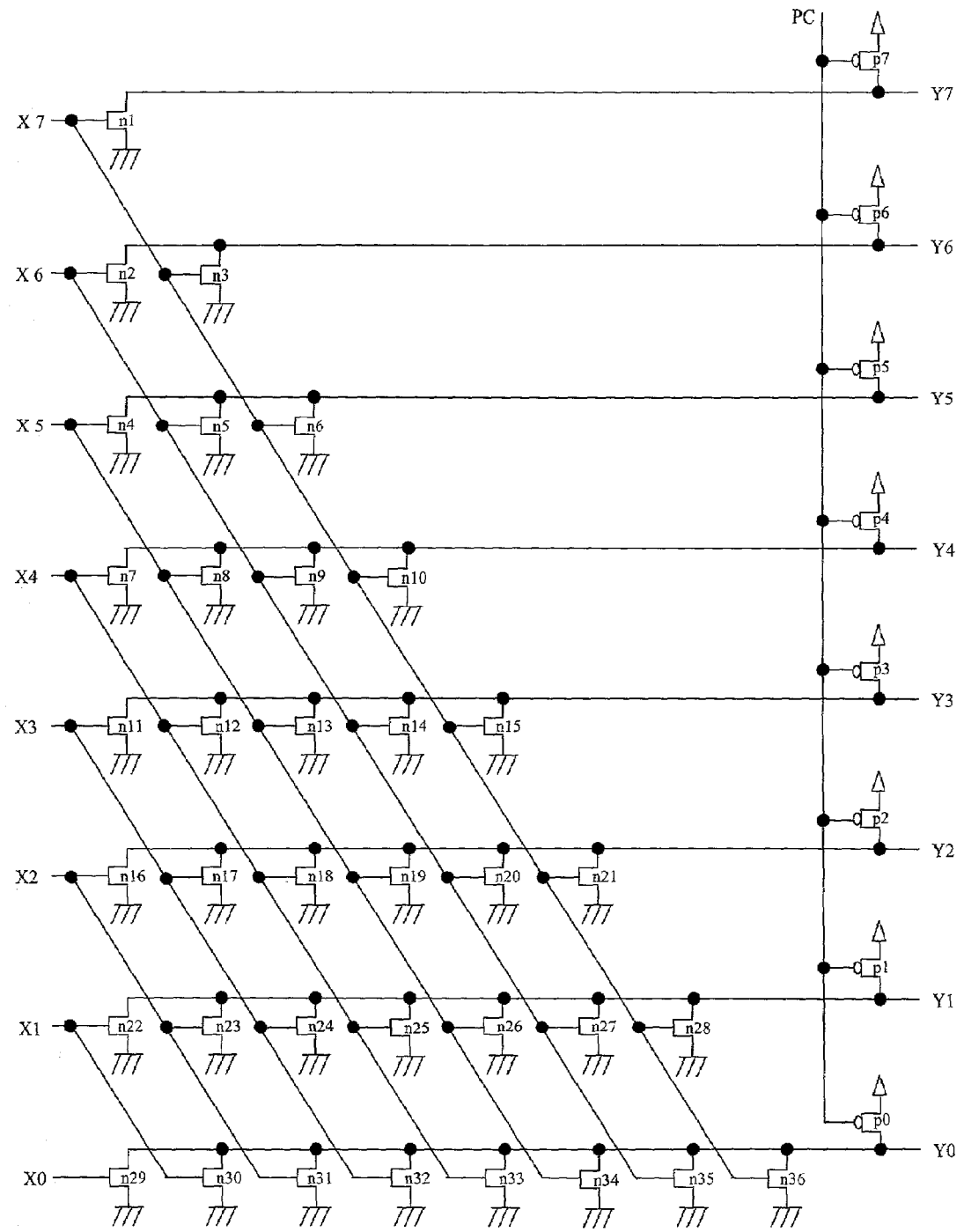
FIG. 7 is a block view showing the detailed configuration of a mask circuit of the second embodiment.

Next, a description while referring to the drawings of a second embodiment of an exponent encoder circuit of the present invention is given. The mask circuit of the present invention can be applied as a mask circuit for the exponent encoder circuit of the second embodiment. The mask circuit shown in FIG. 7 is a preferred embodiment of the mask circuit for this invention.

Figure 5:
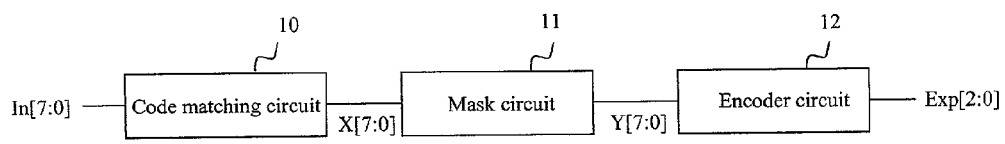
FIG. 5 is a block view showing an exponent encoder circuit of a second embodiment.

FIG. 5 is a block view showing the configuration of an encoder circuit of the second embodiment. The exponent encoder circuit of the second embodiment is for handling input data (refer to table 2) with 8 bits of code and obtains exponent encoding results Exp[2:0] from input data In[7:0].

In FIG. 5, the exponent encoder circuit of the second embodiment comprises a code matching circuit 10, mask circuit 11 and encoder circuit 12 connected together in a slaved manner.

When the input data In[7:0] is a positive number, the code matching circuit 10 allows the data to pass as is, and in the case of a negative number, the data is changed to give a positive number for which the exponent Exp[2:0] is the same, with data X[7:0] after processing being supplied to the mask circuit 11.

With the second embodiment, 0("000") is outputted as the integer which differs from the case in table 1 when the input data In[7:0] is all "1"s.

Figure 6:
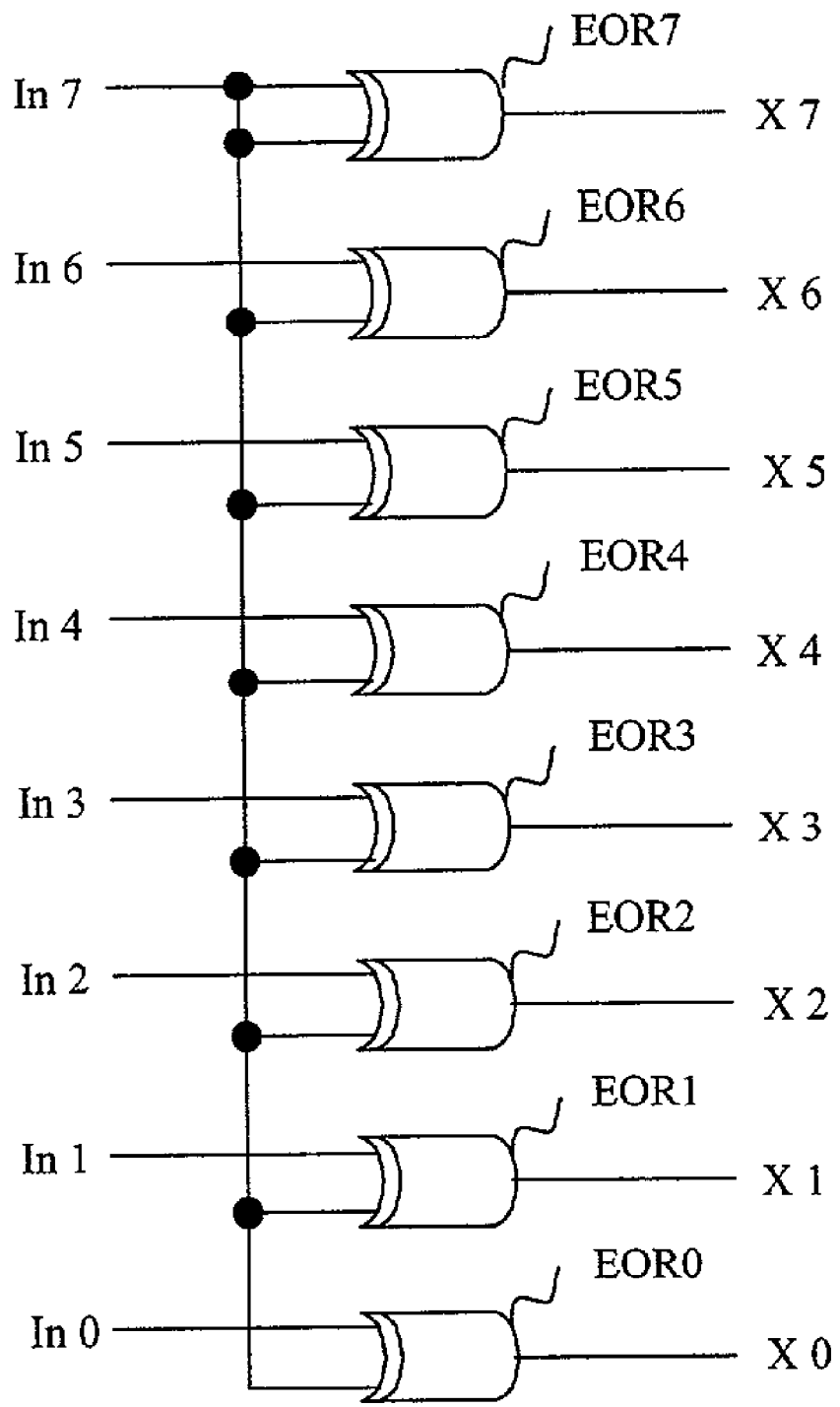
FIG. 6 is a block view showing the detailed configuration of a code matching circuit of the second embodiment.

As shown, for example, in FIG. 6, the code matching circuit 10 is implemented using 8 two-input exclusive OR circuits EOR7 to EOR0. Code bit In7 of the input data In[7:0] is inputted to all of the exclusive OR circuits EOR7 to EOR0 and each of the bits In7, . . . , In0 of the input data In[7:0] are inputted to corresponding exclusive OR circuits EOR7 to EOR0.

The exclusive OR circuit EOR7 outputs data X7 for "0" showing positive whether the code bit In7 is "0" or "1".

The exclusive OR circuits EOR6 to EOR0 invert the input data In6, . . . , In0 for output as data X6, . . . , X0 when the code bit In7 is "1", and outputs data X6, . . . , X0 that is the same as the input data In6, . . . , In0 when the code bit In7 is "0".

The mask circuit 11 forms data Y7, . . . , Y0 including a bit "1" positioned at the most significant bit, with all of the logic levels for bits positioned with a lower significance being made one logic level (for example, "0") and the logic level of bits at positions of higher significance being all another logic level (for example, "1").

FIG. 7 is a circuit diagram showing a specific example of a configuration for the mask circuit 11. The mask circuit 11 shown in FIG. 7 generates output data Y[7:0] by subjecting the input data X[7:0] to a wired OR operation.

PMOS transistors p7 to p0 are provided for pre-charging the output lines Y7 to 70 that are made to operate by an output line pre-charge signal PC during execution of exponent encoding. NMOS transistors n1 to n36 for discharging are also provided at each of the output lines Y7 to Y0.

An NMOS transistor n1 for discharging the output line Y7 is connected to the most significant output line Y7 and this operates when input data X7 is "1". Two NMOS transistors n2 and n3 for discharging the output line Y6 are connected to the next most significant output line Y6 and operate when the items of input data X7 and X6 are "1".

Three NMOS transistors n4 to n6 for discharging the output line Y5 are connected to the next most significant output line Y5 and operate when the items of input data X7, X6 and X5 are "1".

A wired OR configuration is also similarly configured by utilizing discharge NMOS transistors n7 to n10, n11 to n15, n16 to n21, n22 to n28 and n29 to n36 for the output lines Y4, . . . , Y0.

In the above configuration, when executing exponent encoding, first, PMOS transistors p7 to p0 are put on by the output signal pre-charge signal PC, the output lines Y7 to Y0 are pre-charged, and input X is then supplied to the output line discharge NMOS transistors n1 to n36. At this time, the output lines Y discharge "0" to the bits that are less significant than the bit positioned where "1" first appears when viewing the input data X from the MSB side.

Namely, the output lines Y[7:0] are signal lines that mask values from where "1" first appears onwards with "0" when the input data X is viewed from the MSB side.

For example, when the input data X is "00110000", the bit position where "1" first appears when viewing from the MSB side is X5. The output data Y therefore includes this bit position 5 and makes less significant bits "0", so that the output data Y becomes "11000000". FIG. 7 the inputted data X7 is taken to be a mask target but the input data X7 is a code bit and the mask target may therefore be made the range of input data X6 to X0.

Further, conversely to FIG. 7, a circuit where the output signal is pre-discharged to "0", and charging takes place according to the input data X6 to X0. Namely, a configuration where the PMOS transistor in FIG. 7 is changed to an NMOS transistor and the NMOS transistor of FIG. 7 is changed to a PMOS transistor is also possible.

An existing parallel shifter circuit etc. may be used as the mask circuit 11. Reductions in circuit scale are made possible if a parallel shifter is employed.

The encoder circuit 12 generates the exponent Exp[2:0] from the output (mask results) Y[7:0] of the mask circuit 11.

Figure 8:
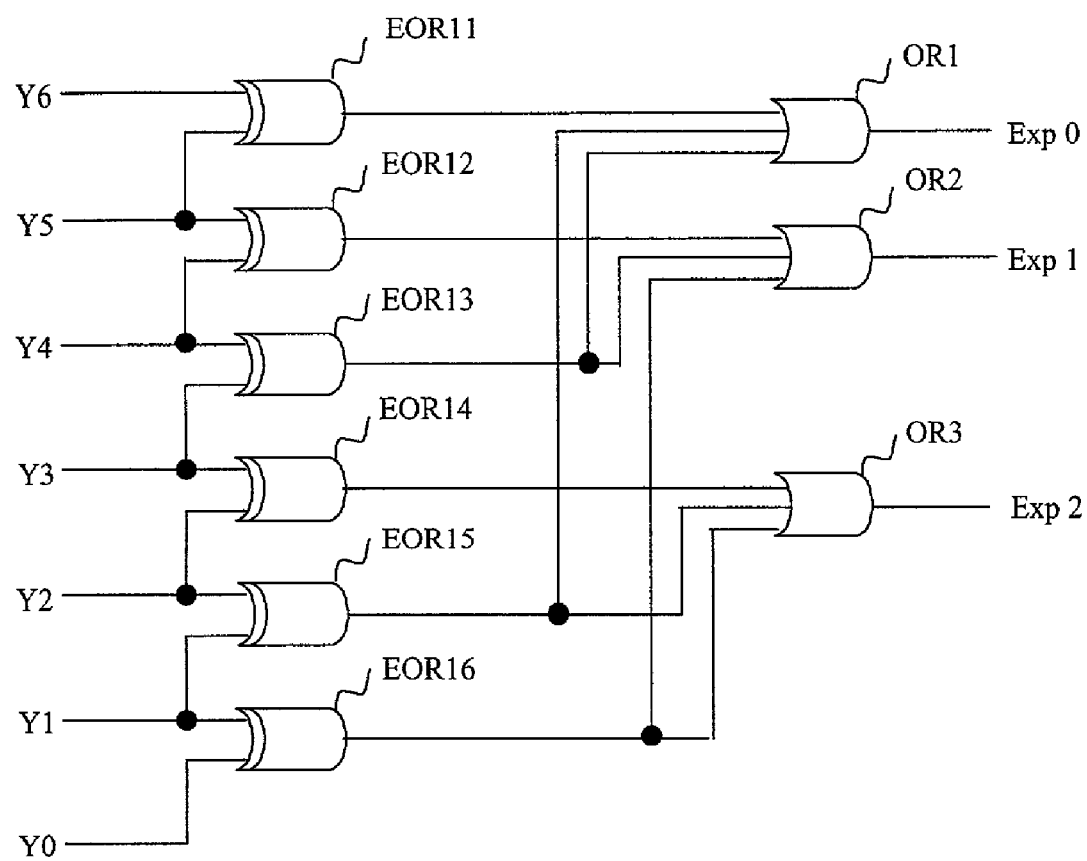
FIG. 8 is a block view showing the detailed configuration of an encoder circuit of the second embodiment.

FIG. 8 is a block view showing an example configuration for the encoder circuit 12. In FIG. 8, a configuration is adopted where the input data Y7 bears no relation to the generation of the exponent Exp[2:0], with the exponent Exp[2:0] being generated from the input data Y6 to Y0.

In FIG. 8, the encoder 12 comprises six two-input exclusive OR circuits EOR11 to EOR16 and three three-input OR circuits OR1 to OR3.

The input data Y6 to Y0 does not have a fixed boundary but is data where "1"s are present on the more significant side and "0"s are present on the less significant side as a result of the function of the mask circuit 11. The exclusive OR circuits EOR11 to EOR16 are used for detecting this boundary. Outputs indicating whether each two neighboring bits of the input data Y6 to Y0 match or do not match are then formed at each of the exclusive OR circuits EOR11, . . . , EOR16. This means that only the exclusive OR circuit for one of the two bits inputted that are sandwiching the boundary (when there is no boundary this is zero) will output a "1".

The OR circuits OR1 to OR3 decode the boundary detection results due to the exclusive OR circuits EOR11 to EOR16 and generate an exponent Exp[2:0].

For example, when the data Y is "11000000", the boundary between "1" and "0" exists between the sixth bit and the fifth bit (the least significant bit is taken to be a 0 bit), and the output of the exclusive OR circuits EOR11 to EOR16 becomes "100000". 1("001") is then obtained as Exp as a result of encoding this.

The following effects are obtained according to the exponent encoder circuit of the second embodiment.

(1) High speed processing is possible because the output Y[7:0] of the mask circuit 11 can be obtained in one go.

(2) The time until the final results are obtained hardly changes at all even when the inputted bit length is extended and the inputted bit length can therefore easily be extended.

In each of the aforementioned embodiments, examples are shown where exponents for input data with code are obtained but the technical concept of the present invention may also be applied to the input data without any code bits. For example, in the first embodiment, a configuration may be adopted where the logic gates G1 to G8 inverting each of the bits of input data for negative numbers may be omitted. Further, in the second embodiment a configuration may be adopted where the code matching circuit 10 is omitted and the exponent circuit is comprised of the mask circuit 11 and the encoder circuit 12.

Still further, in each of the aforementioned embodiments, a configuration is adopted that inverts portions other than the code bits because input data for negative numbers is handled in the same manner as input data for positive numbers. Conversely, it is also possible to handle the input data for positive numbers in the same manner as input data for negative numbers so that portions other than code bits are inverted, after which the exponent is obtained.

Further, the mask circuit 11 shown in the second embodiment can also be applied to circuits other than exponent encoder circuits.

According to the exponent encoder circuit of the present invention, high-speed processing can be anticipated and the input bit length can easily be extended.

Moreover, according to the mask circuit of the present invention, each bit of the mask output can be obtained in one go.

What is claimed is:

1. An exponent encoder circuit for outputting an output data constituted by a number of bits indicating a left shift amount as an exponent for normalizing input data having code bits showing whether the input data is a positive number or a negative number, the exponent encoder circuit comprising:

a first logic circuit for inverting data portions of the input data other than the code bits and shifting the code bits to least significant bit positions when the input data is one of a negative number or positive number, and allowing data portions other than the code bits to pass as is and moving the code bits to least significant bit positions when the input data is the other of a negative number or a positive number; and a second logic circuit for putting a plurality of logic operation equations for obtaining each bit of an exponent from output of the first logic circuit as decided by a truth table for outputs of the first logic circuit and corresponding exponents in a form where common terms are cancelled out.

2. The encoder circuit of claim 1, wherein the logic circuits are configured in such a manner that a zero detection signal having a marker logic level bit is formed only when all of the input data is "0".

* * * * *